US006462852B1

(12) United States Patent
Paschal et al.

(10) Patent No.: US 6,462,852 B1
(45) Date of Patent: Oct. 8, 2002

(54) SELECTABLE LOW-VOLTAGE DIFFERENTIAL SIGNAL/CURRENT MODE LOGIC (LVDS/CML) RECEIVER WITH THE OPTION OF AC OR DC COUPLING

(75) Inventors: Matthew James Paschal; Kevin Paul Demsky, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/429,281

(22) Filed: Oct. 28, 1999

(51) Int. Cl.$^7$ .................. H04B 10/06; H04B 10/00; H03K 19/20; H03K 19/086; H03K 19/0175
(52) U.S. Cl. .............. 359/189; 359/152; 359/154; 326/115; 326/127; 326/82
(58) Field of Search .................. 359/189, 152; 329/82, 83, 115, 127; 327/203

(56) References Cited

U.S. PATENT DOCUMENTS

| 4,958,133 | A | | 9/1990 | Bazes ..................... 330/253 |
| 5,113,095 | A | | 5/1992 | Huehne ................... 307/446 |
| 5,283,482 | A | | 2/1994 | Chen ...................... 307/475 |
| 5,486,777 | A | * | 1/1996 | Nguyen ..................... 326/68 |
| 5,832,047 | A | | 11/1998 | Ferraiolo et al. ......... 375/356 |
| 5,963,053 | A | * | 10/1999 | Manohar et al. ........... 326/60 |
| 6,034,551 | A | * | 3/2000 | Bridgewater, Jr. ......... 326/82 |

OTHER PUBLICATIONS

Bazes; "Two Novel Fully Complementary Self–Biased CMOS Differential Amplifiers", IEEE JSSC, vol. 26, No. 2, Feb. 1991, pp. 165–168.

IBM TDB vol. 34, No. 3, Aug. 1991, "High–Speed Bipolar Voltage/Current Receiver Circuit" pp. 254–255.

IEEE Standards Status Report, IEEE Standard For Low–Voltage Differential Signals (LVDS) For Scalable Coherent Interface (SCI) 1596.3–1996.

\* cited by examiner

*Primary Examiner*—Jason Chan
*Assistant Examiner*—M. R. Sedighian
(74) *Attorney, Agent, or Firm*—Christopher H. Lynt; Matthew J. Bussan (57) ABSTRACT

A selectable receiver includes a first receiver module for receiving first input signal type and a second receiver module, different from the first receiver module, for receiving a second input signal type, both receiver modules coupled to the same receiver inputs. An internal common mode voltage for the first signal type or for the second signal type, is provided by respective common mode voltage networks, to the first or to the second receiver module, to facilitate AC coupling with the appropriate DC common mode voltage required by the signal type. If direct coupled, the internal common mode voltage is effectively swamped out by the common mode voltage of the input signal. The first receiver module or the second receiver module, and the associated first common mode voltage or second common mode voltage, are selected in the receiver based on a control signal. The first receiver module can be a current mode logic (CML) receiver, and the second receiver module can be a low-voltage differential (LVDS) receiver module, e.g., a self-timed interface (STI) receiver module.

26 Claims, 8 Drawing Sheets

| RECSEL | DSBL | CML-AC CMV Network | STI-AC CMV Network | Pass Gate T2 | Pass Gate T3 | CML receiver | STI receiver |
|---|---|---|---|---|---|---|---|
| 1 | 0 | OFF | ON | OFF | ON | OFF | ON |
| 0 | 1 | OFF | OFF | OFF | OFF | OFF | OFF |
| 0 | 0 | ON | OFF | ON | OFF | ON | OFF |
| 1 | 1 | OFF | OFF | OFF | OFF | OFF | OFF |

Table 1. (Truth table of circuit operation)

(internal detail view of STI receiver)

SELECTABLE LOW-VOLTAGE DIFFERENTIAL SIGNAL/CURRENT MODE LOGIC (LVDS/CML) RECEIVER WITH THE OPTION OF AC OR DC COUPLING

BACKGROUND OF THE INVENTION

FIELD OF THE INVENTION

The invention relates to the field of data communications, and in particular, to facilitating integrated circuit-to-integrated circuit (IC-IC) differential communication involving integrated circuits having different logic topologies, by providing the ability to accept two or more different input/output (I/O) signal voltage levels, which are either direct coupled or AC coupled therewith.

BACKGROUND INFORMATION

With the increasing needs for communication between IC's at relatively high data rates, e.g., data rates of above 1.0 Gigabits/second, the use of differential signals is becoming increasingly popular. One reason is because the reduced voltage swings of differential signals increase the achievable maximum data rate. Also, inherent characteristics, such as lower self generated switching noise, reduced electromagnetic interference (EMI), better input noise rejection and power supply rejection, are attractive features of logic having a so-called 'differential topology'.

Particularly in the field of telecommunications, bipolar CML (current mode logic) or PECL (positive emitter-coupled logic) are preferred, due to higher speed, lower skew, and less jitter than a low-voltage differential signal (LVDS), self-timed interface (STI), or dynamic CMOS (complimentary metal oxide semiconductor) design.

However, one problem for the designer is that these differential logic families which are currently popular, are not compatible with each other because of t e different voltage levels used to represent the same logic level!.

By way of explanation, integrated circuitry in the emitter-coupled logic (ECI) family uses bipolar-transistors and has the advantages of being very fast, having high input resistance, having low output resistance, and having low noise generation. However, ECL logic signal levels, referenced to a power supply voltage terminal commonly labeled VCC, are approximately (VCC−VBE) for a logic high voltage, and (VCC−2VBE) for a logic low voltage, where VBE is the forward biased base-emitter diode voltage drop of a corresponding bipolar transistor. With ECL, in order to provide the logic high voltage (VCC−VBE), however, an extra transistor is necessary. A similar type of logic using bipolar transistors, known as current-mode logic (CML), eliminates the need for an extra transistor by providing a logic high voltage of VCC, and a logic low voltage of approximately (VCC−VBE). The output level is thus more constrained but in many cases the saving of a transistor is advantageous.

Presently, metal oxide semiconductor (MOS) transistors are commonly fabric ted in integrated circuits along with bipolar transistors. As a result, some logic circuits providing CML level output signals are required to receive at least one input signal compatible with the MOS transistors in addition to receiving at least one CML level input signal.

However, complementary metal oxide semiconductor (CMOS) signal levels differ from ECL. and CML signal levels. In so-called full-swing CMOS signals, a logic high voltage is approximately VCC, whereas a logic low voltage is approximately a second power supply voltage, commonly labeled "VSS", which is negative with respect to VCC. As can be appreciated, when CMOS levels are applied to a base of a bipolar transistor in a CML logic circuit, reliability problems can result because of the differences in logic level voltages.

For example, a large reverse bias, which occurs if a CMOS logic low voltage (about VSS) is applied to the base of an input bipolar transistor while the emitter is held at or near a CML logic high voltage (VCC−VBE), is harmful to the operation of the input bipolar transistor. When a large reverse bias is applied across the base-emitter junction of a bipolar transistor, degradation occurs. Over time, the constant application of this large reverse bias may cause the input bipolar transistor to fail, resulting in a failure of the entire integrated circuit. Electronically, a large reverse bias on a PN junction causes hot carrier injection into the overlying oxide, resulting in poor junction performance. The amount of hot carrier injection is proportional to the time the reverse bias occurs. The size of the reverse bias is related to the mean life of the transistor, for given worst case conditions, by an inverse semi-logarithmic relationship. As the reverse bias decreases linearly, mean life increases exponentially. At typical values for reverse bias, transistor mean life in a mixed CML and CMOS logic circuit may be unacceptably short.

Therefore, full-swing CMOS can damage bipolar circuitry. However, Seven low-voltage differential signal (LVDS) CMOS signals can cause problems with bipolar circuitry, and the low signal levels may not be able to drive the bipolar circuitry.

There may be places in the data communication industry, for example, where a CMOS input/output design is preferred over a bipolar one, e.g., in a computer interface whose CMOS outputs swing rail-to-rail (+VCC to VSS=−VCC), or even in lower-voltage signals where the voltage swings around 1.25 volts by plus and minus 0.50 volts, i.e., between 1.75 and 0.75 volts. Thus, there may be situations where either or both CMOS and bipolar signal levels need to be accommodated.

Because of the present need for both CMOS and bipolar communications, an IC manufacturer currently may have to provide for both CMOS and bipolar communications technologies in different products, or in the same product. Clearly, for the chip manufacturer, it would be advantageous to have a single chip design which accommodates both types of receivers.

A possible solution considered by the inventors would be to provide a design in which one integrated circuit chip has both types of receivers on-board, either of which can be selected during manufacture by metal masking, for example, depending on which technology (CMOS or bipolar) is to be supported in the finished chip. However, a disadvantage of this solution is that the product user would still have to purchase both species of the chip to accommodate a design that uses both technologies. A further disadvantage is the cost of the separate metal mask, and another disadvantage is the time and cost of qualifying two parts.

Another solution considered by the inventors is to have both types of receivers integrated in the finished chip and fully operational with their own separates inputs. However, this solution disadvantageously doubles the differential receiver input pin-out increasing costs.

Therefore, the above-described possible solutions are disadvantageous because of the cost of two chips, the cost of a separate metal mask, and/or the increased pin-out requirement for the package. These disadvantages make these solutions less than optimal.

It would be desirable to be able to accommodate both technologies with one receiver chip without requiring masking or increasing the pin-out.

Therefore, a need exists for an optimal solution to the problem of accommodating both CMOS and bipolar technologies in a single chip (IC) which can receive (and/or send) two different input/output levels, without the disadvantages of the other above-mentioned possible solutions.

U.S. Pat. No. 5,283,482 by Chen, issued Feb. 1, 1994, describes (Abstract) a CMOS circuit for receiving ECL signals which includes a triple-feedback arrangement for dynamically biasing a current source transistor of a differential amplifier of the CMOS circuit. The CMOS receiver circuit has a differential amplifier for generating an output signal representative of the difference between a reference signal and an ECL input signal, and an inverter circuit for receiving the output signal and generating a CMOS compatible output signal. The differential amplifier includes a first current source transistor. A first CMOS transistor is connected to receive the ECL input signal and a second CMOS transistor is connected to receive the reference signal. The first and second CMOS transistors have their drains coupled to first and second load transistors, respectively, and their sources coupled to one another and to a second current source transistor for generating a first control signal representative of the difference between the ECL input signal and the reference signal at the drain. of the first CMOS transistor. A first feedback path connects the first control signal to the second current source transistor. A second feedback path connects the first control signal to the first and second load transistors. A third feedback path connects the drain of the second CMOS transistor to the first current source transistor for dynamically biasing the first current source transistor.

However, this only provides for receiving ECL signals (bipolar) and converting them to CMOS signals for use in CMOS circuitry. The circuitry is not for receiving two different types of differential inputs. Further, the circuitry provides a differential input to single ended, full swing output conversion, as opposed to being a fully differential circuit.

U.S. Pat. No. 5,113,095 by Huehne, issued May 12, 1992, describes (Abstract) a logic circuit for receiving both CMOS and CML level input voltages which performs a logical OR function. A reference bipolar transistor is coupled to a first power supply voltage terminal through a first resistor. A second bipolar transistor for receiving a CML level input signal is coupled to the first power supply voltage terminal through a second resistor. Emitters of the bipolar transistors are connected together. A MOS transistor for receiving a CMOS level input signal has a drain connected to a collector of the second bipolar transistor, and a voltage dropping portion separate the source of the MOS transistor from the emitters of the reference transistor and the bipolar transistor. The input voltages control a constant current conducted from a current source connected to the source of the MOS transistor. The logic circuit allows mixed logic levels without subjecting the bipolar transistors to a large base-to emitter reverse bias caused by CMOS logic levels.

However, this prior known arrangement is an OR gate with two inputs, where one input is CMOS level and the other is single-ended CML. Therefore, the arrangement is not a receiver per se, is not for differential signals, and would not work for high-speed communications.

U.S. Pat. No. 4,958,133 Bazes issued Sep. 18, 1990 describes (Abstract) a CMOS complementary, self-biased, differential amplifier which provides for a rail-to-rail common-mode input-voltage range of operation. A self-biasing scheme is used to provide negative feedback to the amplifier in order to assist in providing a common-mode rejection but providing high gain amplification for differential-mode amplification. With reference to the patent FIG. 1, essentially, this amplifier receives differential inputs (A-11 and B-12) and produces a single-ended output (OUT-13). An apparently related IEEE Journal of Solid-State Circuits, Vol. 26, No. 2, February 1991, by Mel Bazes, describes "Two Novel Fully Complementary Self-Biased CMOS Differential Amplifiers" (Title).

IBM Technical Disclosure Bulletin Vol. 34, No. 3, August 1991 (pages 254–255) describes a "High-Speed Bipolar Voltage/Current Receiver Circuit" (Title) for a serial link with the receiver requiring 2 differential inputs, 4 pins, per channel. The circuit described provides a means of inputting either emitter coupled logic (ECL) or current mode logic (CML,) signals in a single integrated circuit. However, this arrangement requires separate input pins for the respective signals. Therefore, it would not be practical for a parallel link due to the receiver requiring two differential inputs (4 pins) per channel. For a single channel, the arrangement is fine. However, for 12 channels, for example, the pin requirement disadvantageously jumps to 48. Packaging is a premium, and contributes to cost.

Therefore, a need exists for a selectable receiver for accommodating both bipolar and CMOS type signals without the disadvantages of the prior solutions.

There is known an IEEE Standard for Low-Voltage Differential Signals (LVDS) for Scaleable Coherent Interface (SCI) (IEEE Std 1596.3-1996). A Scaleable Coherent Interface (SCI), specified in IEEE Std 1596-1992, provides computer-bus-like services but uses a collection of fast point-to-point links instead of a physical bus in order to reach far higher speeds. The base specification defines differential ECL signals, which provide a high transfer rate (16 bits are transferred every 2 ns), but are inconvenient for some applications. Therefore, IEEE Std 1596.3-1996, an extension to IEEE Std 1596-1992, defines a lower-voltage differential signal (as low as 250 mV swing) that is compatible with low-voltage CMOS, BiCMOS, and GaAs circuitry. The power dissipation of the transceivers is low, since only 2.5 mA is needed to generate this differential voltage across a 100-ohm termination resistance. Signal encoding is defined that allows transfer of SCI packets over data paths that are 4-, 8-, 32-, 64-, and 128-bits wide. Narrow data paths (4 to 8 bits) transferring data every 2 ns can provide sufficient bandwidth for many applications while reducing the physical size and cost of the interface. The wider paths may be needed for very-high-performance systems.

There is a known low-voltage differential signal (LVDS) CMOS interface called the self timed interface (STI). Briefly, a self-timed interface (STI) provides a clock signal which clocks bit serial data onto a parallel, electrically conductive bus and the clock signal is transmitted on a separate line of the bus. The received data on each line of the bus is individually phase aligned with the clock signal. The received clock signal is used to define boundary edges of a data bit cell individually for each line and the data on each line of the bus is individually phase adjusted so that, for example, a clock transition position is in the center of the data cell. See for example U.S. Pat. No. 5,832,047, Ferraiolo et al., dated Nov. 3, 1998, entitled "SELF TIMED INTERFACE" assigned to the same assignee as the present application.

However, a need exists for a receiver with the flexibility of AC or DC coupling. In particular, a selectable low-voltage differential signal/current mode logic (LVDS/CML) receiver which supports both AC and DC coupling.

A large amount of equipment is already in the field for data communications, telecommunications, and the computer industry, and all have slightly different input/output level requirements. However, they all share the need for higher speed communication, with smaller packages, and lower cost.

Therefore, a need also exists for an improved relatively high-speed receiver which can accommodate the various technologies, e.g., a 3.3 VDC (LVDS) selectable STI/CML receiver with respective bandwidths of DC up to 1.6/2.2 Gigabit/s, which would enable an IC manufacturer to serve two large established communications customer bases, while only developing, testing, and supporting one chip.

SUMMARY OF THE INVENTION

It is, therefore, a principle object of this invention to provide a method an d apparatus for a selectable relatively high-speed differential receiver, in particular, a selectable receiver with the option of AC or DC coupling.

It is another object of the invention to provide a method and apparatus that solves the above mentioned problems so that a selectable receiver with the option of AC or DC coupling is provided while pin numbers are kept to a minimum.

These and other objects of the present invention are accomplished by the method and apparatus disclosed herein.

A 3.3-volt selectable low-voltage differential/current mode logic, e.g., STI/CML, receiver according to an exemplary embodiment of the invention, solves the problems discussed at the outset, in addition to offering the choice of AC or DC coupling, with bandwidth suitable for DC to greater than Gigabit per second data transmission speed.

Advantageously, the novel receiver can achieve requirements of two customers with the same data communication needs, but different input/output level requirements.

According to an aspect of the invention, an exemplary receiver is a fully differential high speed receiver.

According to an aspect of the present invention, the exemplary interface is fully differential, receives two types of differential signals, and provides AC or DC coupling. By contrast, U.S. Pat. No. 5,283,482, for example, describes differential to single ended conversion, full swing output.

According to an aspect of the present invention, pin requirements are kept to a minimum. For 12 channels, for example, only 24 pins would be required in the exemplary embodiment. As mentioned in the Background section above, a prior arrangement for a serial link, described in the IBM TDB (Vol. 34, No. 3, 1991), is not practical for a parallel link due to the receiver requiring two differential inputs 4 pins per channel. For 12 channels, for example, the pin requirement jumps to 48. Since packaging is a premium, and contributes to cost, the present invention has advantages in this regard.

These and other aspects of the invention will become apparent from the detailed description set forth below.

DETAILED DESCRIPTION OF THE PREFERRED EMBODIMENT(S)

The invention will now be described in more detail by way of example with reference to the embodiment(s) shown in the accompanying figures. It should be kept in mind that the following described embodiment(s) is/are only presented by way of example and should not be construed as limiting the inventive concept to any particular physical configuration.

Figure 1A:
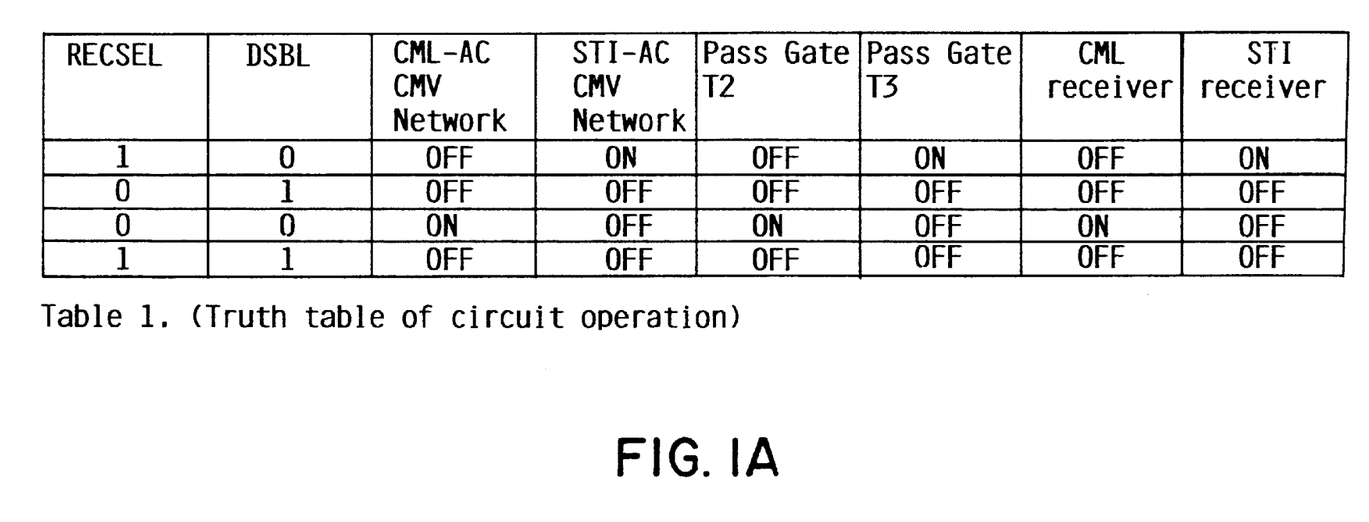
FIG. 1 illustrates a circuit diagram of an exemplary embodiment of the present invention.
Figure 1B:
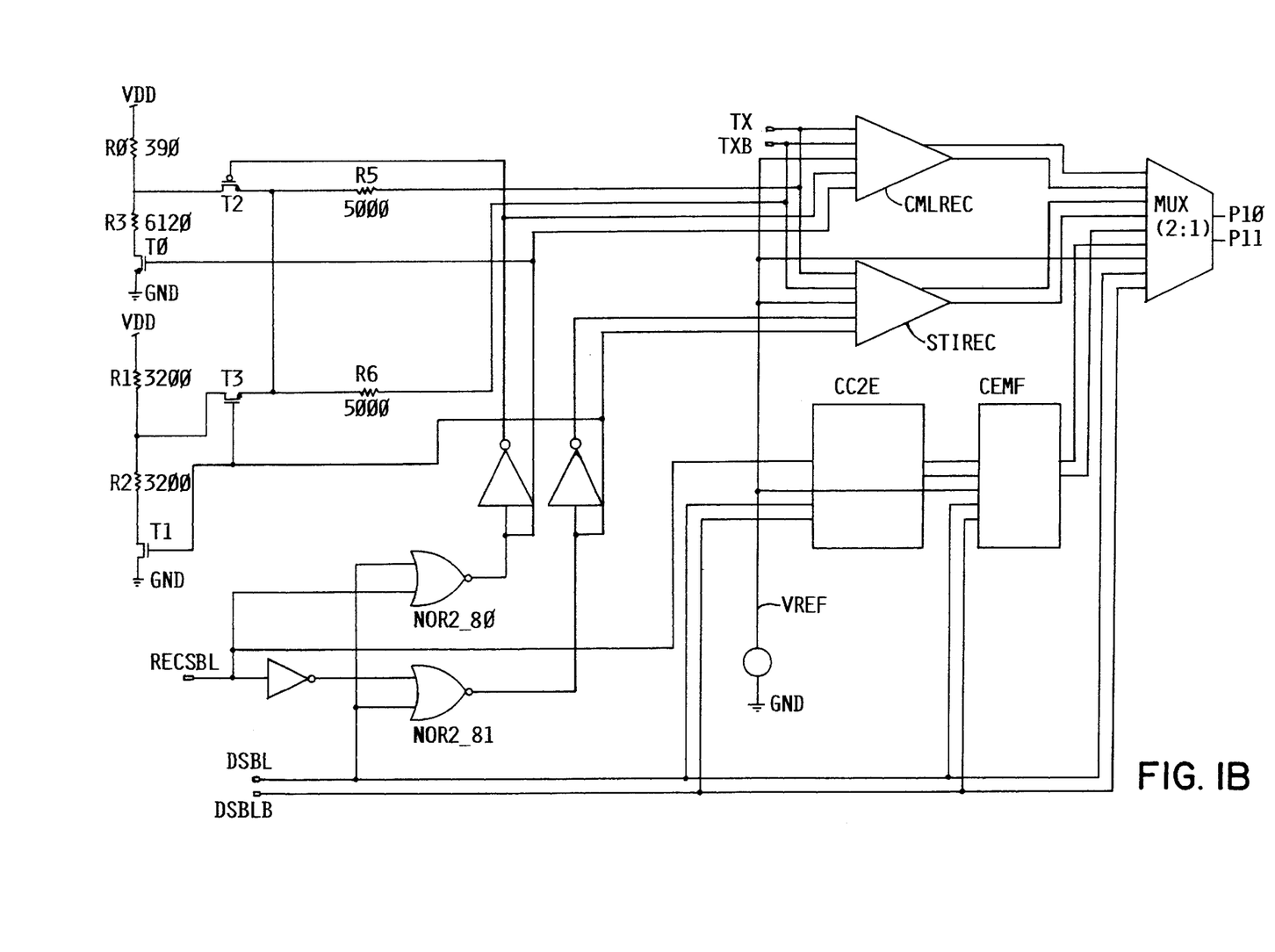

FIG. 1 illustrates an exemplary embodiment of the invention in a representative implementation. The logic circuitry (inverters and NOR gates, CC2E and CEMF) are illustrated to show a complete representative implementation of the invention. Truth Table 1 illustrates the states of the common mode voltage networks (CML common mode voltage network R0, R3, T0 and STI common mode voltage network R1, R2, T1), pass transistors (pass gates T2 and T3) and the receivers (CML and STI) for states of the input control signals (RECSEL and DSBL). A reference voltage source VREF is also provided as shown in FIG. 1.

Conceptually, according to an exemplary embodiment of the invention, a combined receiver has one pair of differential inputs (TX, TXB in FIG. 1) which are connected to both a differential CML and STI receiver module (CMLREC and STIREC in FIG. 1). Only one receiver module is enabled at; a time by a pass gate (T2 and T3 in FIG. 1), and only one receiver is powered on at a time.

With a select signal (DSBL and DSBLB), the STI pass gate (T3 in FIG. 1) or the CML pass gate (T2 in FIG. 1.) will turn on. This passes the appropriate DC common mode voltage provided by the respective common mode voltage networks (CML common mode voltage network R0, R3, T0 and STI common mode voltage network R1, R2, T1), for either the STI levels or the CML levels to the differential inputs (TX, TXB) through a relatively high impedance resistance (R5 and R6, respectively). As mentioned before, the invention is not limited to STI, but will accommodate any low-voltage differential signal (LVDS).

Therefore, if AC coupling is needed, the common mode voltage provided, by a respective one of the common mode voltage networks T0-R0-R3 and T1-R1-R2, is passed to the respective receiver module CMLREC or STIREC through respective pass transistors T2 and T3, and respective series resistances R5 and R6. Providing this common mode voltage is necessary with AC coupling due to the DC blocking caps (not shown) connected to the differential inputs TX and TXB that will not allow the common mode voltage to pass through which is needed by both the STI and CML receivers.

However, if DC coupling is used to couple the input signals TX and TXB to the receiver module inputs, the lower impedance driver circuitry (not shown) which is driving the differential input signals TX and TXB, will be able to deliver its common mode voltage to TX and TXB.

Typical resistance values to implement the voltage divider networks for the exemplary STI/CML embodiment shown in FIG. 1 are R0=390 Ω, R1=3200 Ω, R2=3200 Ω, R3=6120 Ω, R5=5000 Ω, and R6=5000Ω. However, the invention is not limited to these particular values, or ratios of resistance values.

In the FIG. 1 implementation, the RECSEL (receiver module select) signal and the DSBL (disable) signal are provided to inputs of NOR gate 2_80, whose output is provided directly to gate T0 and the CML receiver module, and through an inverter, to the CML receiver module CML-REC and pass gate T2, to control the CML related circuitry.

To control the STI related circuitry, the RECSEL signal is inverted and then provided to the input of NOR gate 2_81 which also receives the DSBL signal at another input. The output of NOR gate 2_81 is provided to the STI receiver module STIREC, the gate T1, and the pass gate T3 directly and, through another inverter, to the STI receiver module STIREC.

At the same time, the receiver module select signal RECSEL, which determines which mode the receiver is in, also selects which receiver module output is multiplexed by MUX to the output of the receiver to provide the receiver differential output signal (10, 11). The logic circuitry also controls which receiver module receives power, thus saving power and eliminating cross-talk and self generated noise by disabling one receiver module when the other is operational.

The FIG. 1 circuit operation described above at a high level, is based on the input signals RECSEL and DSBL (and DSBLB), and is presented in truth-table form in Table 1. The signal "DSBLB", for DSBL bar, i.e., an inverted DSBL signal which is shown in FIG. 1 is provided with DSBL to enable/disable the respective circuits. However, DSBLB is not included in table 1 because tabulating it would be unnecessary to one skilled in the art—it is simply the inverted DSBL signal.

Considering the operation of the illustrated implementation in more detail, and consistent with the truth table (Table 1), for receiving a CML signal, the RECSEL signal is low (0) and the DSBL signal is low (0), the CML AC CMV (common mode voltage) network (R0-R3 and T0) is ON, pass gate T2 is ON and the CML receiver module CMLREC is ON. At this time, the STI AC CMV (common mode voltage) network (R1-R2 and T1) is OFF, the pass gate T3 is OFF, and the STI receiver module STIREC is OFF.

For receiving an STI signal, the RECSEL signal is high (1) and the DSBL signal is low (0), the STI AC CMV network (R1-R2 and T1) is ON, pass gate T3 is ON and the STI receiver module STIREC is ON. At this time, the CML AC CMV network (R0-R3 and T0) is OFF, the pass gate T2 is OFF, and the CML receiver module CMLREC is OFF.

As can be seen from the truth table (Table 1), if the RECSEL signal and the DSBL signal are low (0) and high (1), respectively, or if they are both high (1), then neither of the STI or the CML receiver modules is ON, and neither of the common mode voltage networks is ON. Having both receivers off is the state in which quiescent current testing is done, and further saves power when no signal receiving is going on.

As mentioned above, if the input signals TX, TXB are provided by AC coupling (through DC blocking capacitors) then the respective common mode voltage network will provide a common mode voltage. If the input: signals TX, TXB are provided by DC coupling, the associated low impedance driver circuitry will provide the common mode voltage.

In the implementation shown in FIG. 1, support circuitry blocks CC2E and CEMF are used to select which signal is output from the multiplexer MUX. Block CC2E converts the single-ended CMOS level RECSEL signal to ECL (emitter coupled logic level, i.e., bipolar differential), while CEMF (an emitter follower) down shifts the voltage from CC2E (by a VBE) to control the multiplexer MUX. As such, these support circuit blocks are essentially signal conditioning circuitry for the specific implementation illustrated. One skilled in the art would recognize that other implementations are possible, and these are not intended to limit the invention to the implementation shown.

Figure 2:
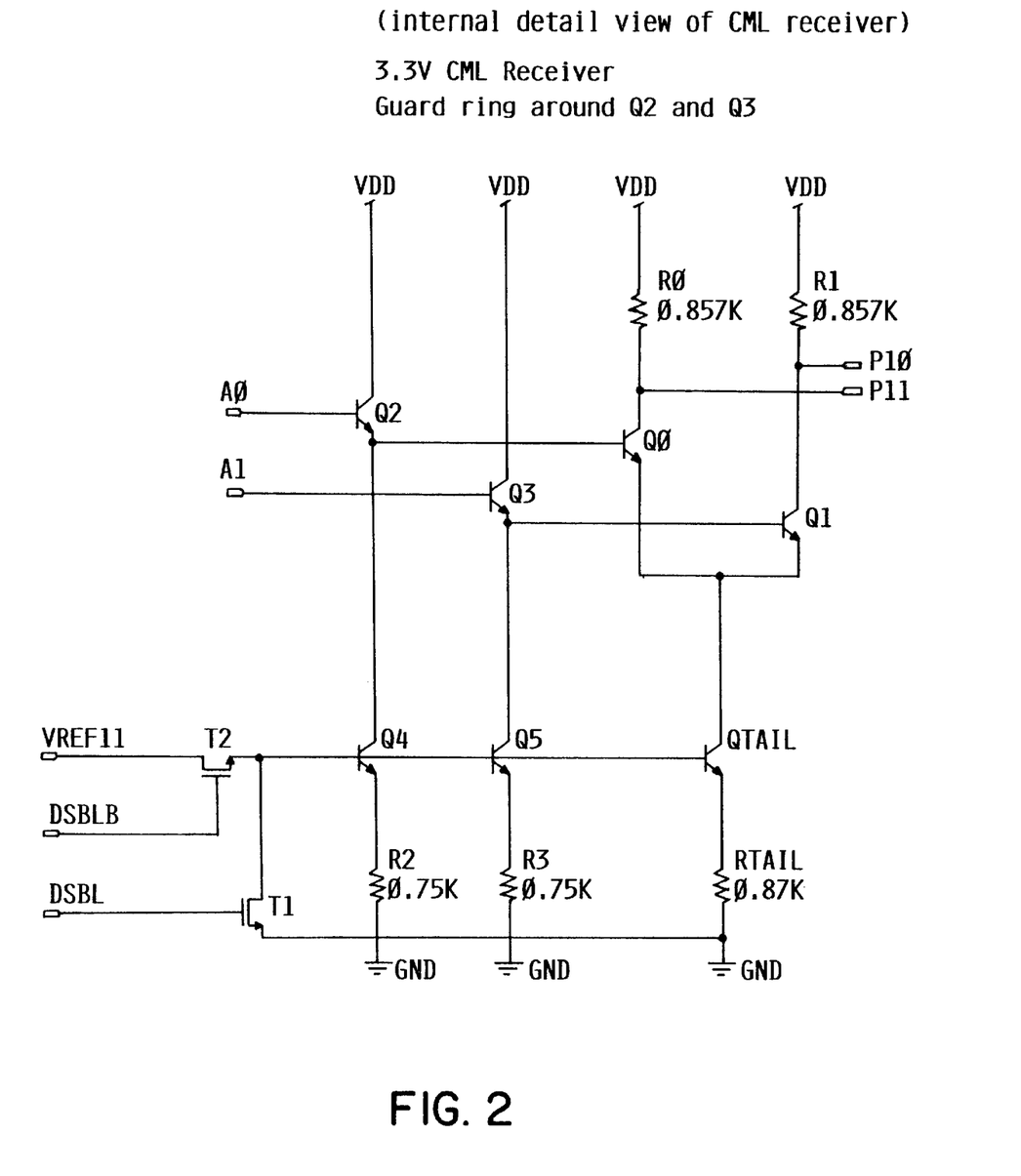
FIG. 2 illustrates an internal detail view of the CML receiver portion of the exemplary embodiment of the invention shown in FIG. 1.
Figure 3:
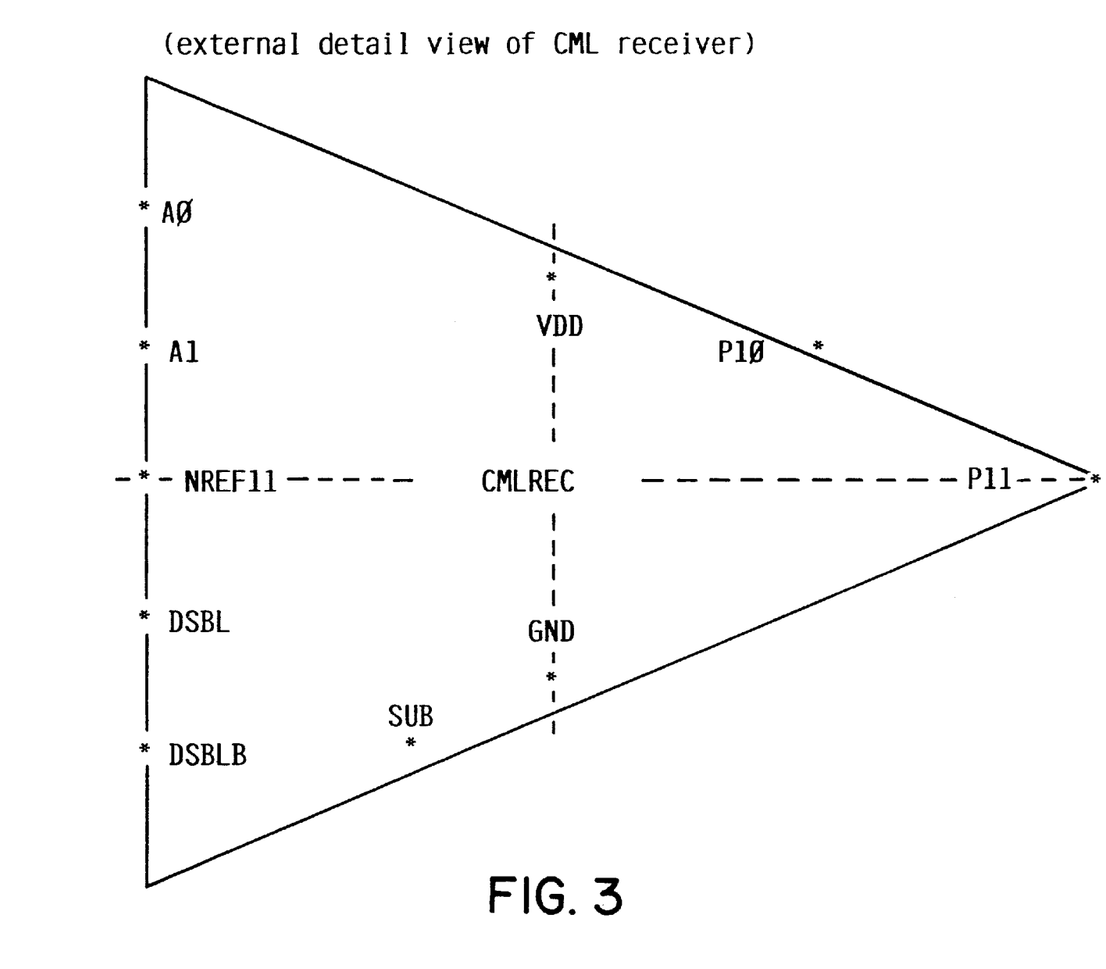
FIG. 3 illustrates an external detail view of the CML receiver according to an exemplary embodiment of the invention shown in FIG. 1.

FIG. 2 illustrates an internal detail view of a CML receiver portion which can be used in the exemplary embodiment of the invention shown in FIG. 1. In order that the signals can be more readily seen, FIG. 3 illustrates an external detail view of the CML receiver according to an exemplary embodiment of the invention shown in FIG. 1. This current mode logic (CML) receiver is presented by way of example and does not limit the invention to the particular implementation shown.

Figure 4:
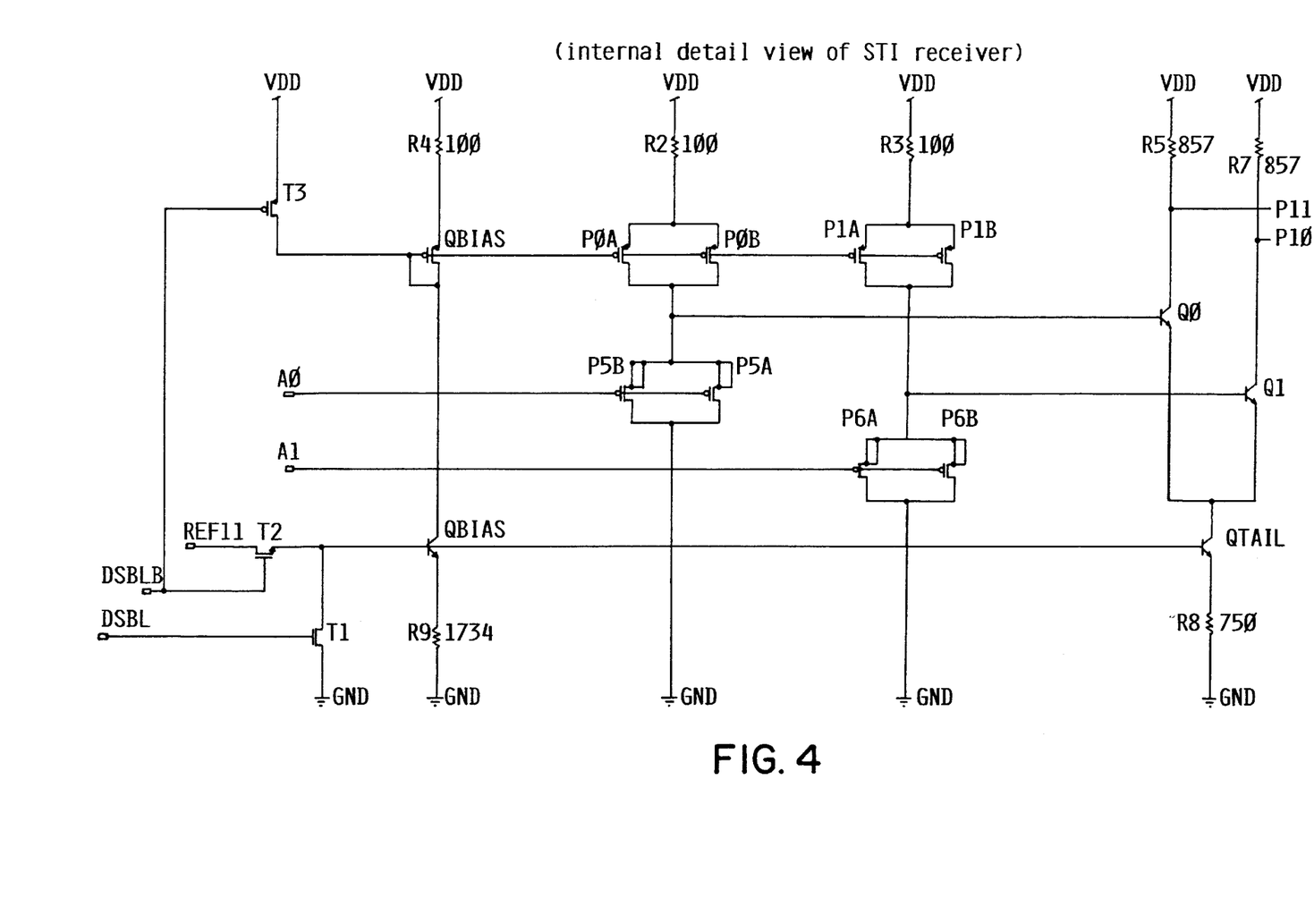
FIG. 4 illustrates an internal detail view of the STI receiver according to an exemplary embodiment of the invention shown in FIG. 1.
Figure 5:
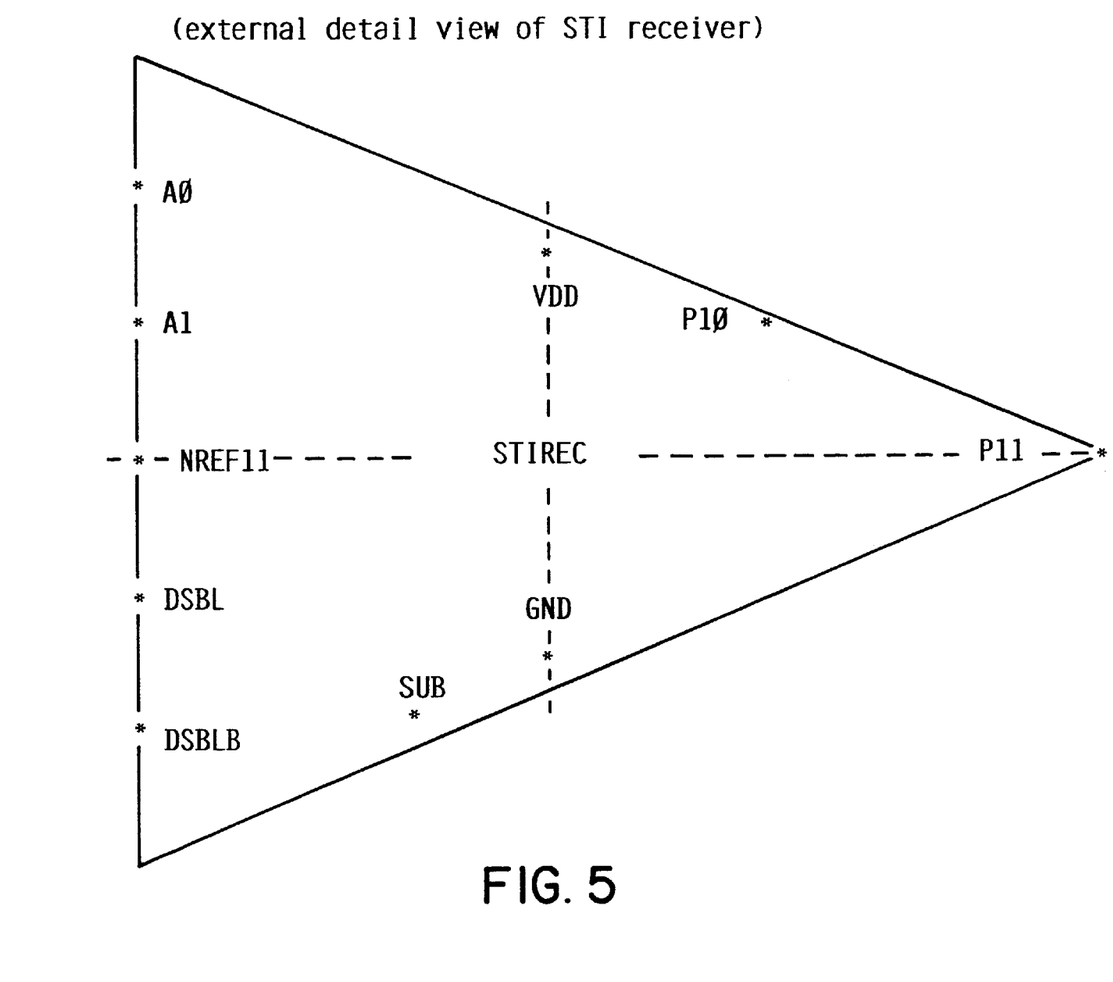
FIG. 5 illustrates an external detail view of the STI receiver according to an exemplary embodiment of the invention shown in FIG. 1.

FIG. 4 illustrates an internal detail view of the STI receiver according to an exemplary embodiment of the invention shown in FIG. 1, and, in order that the signals can be more readily seen, FIG. 5 illustrates an external detail view of the STI receiver according to an exemplary embodiment of the invention shown in FIG. 1. This STI receiver is presented by way of example and does not limit the invention to the particular implementation shown.

Figure 6A:
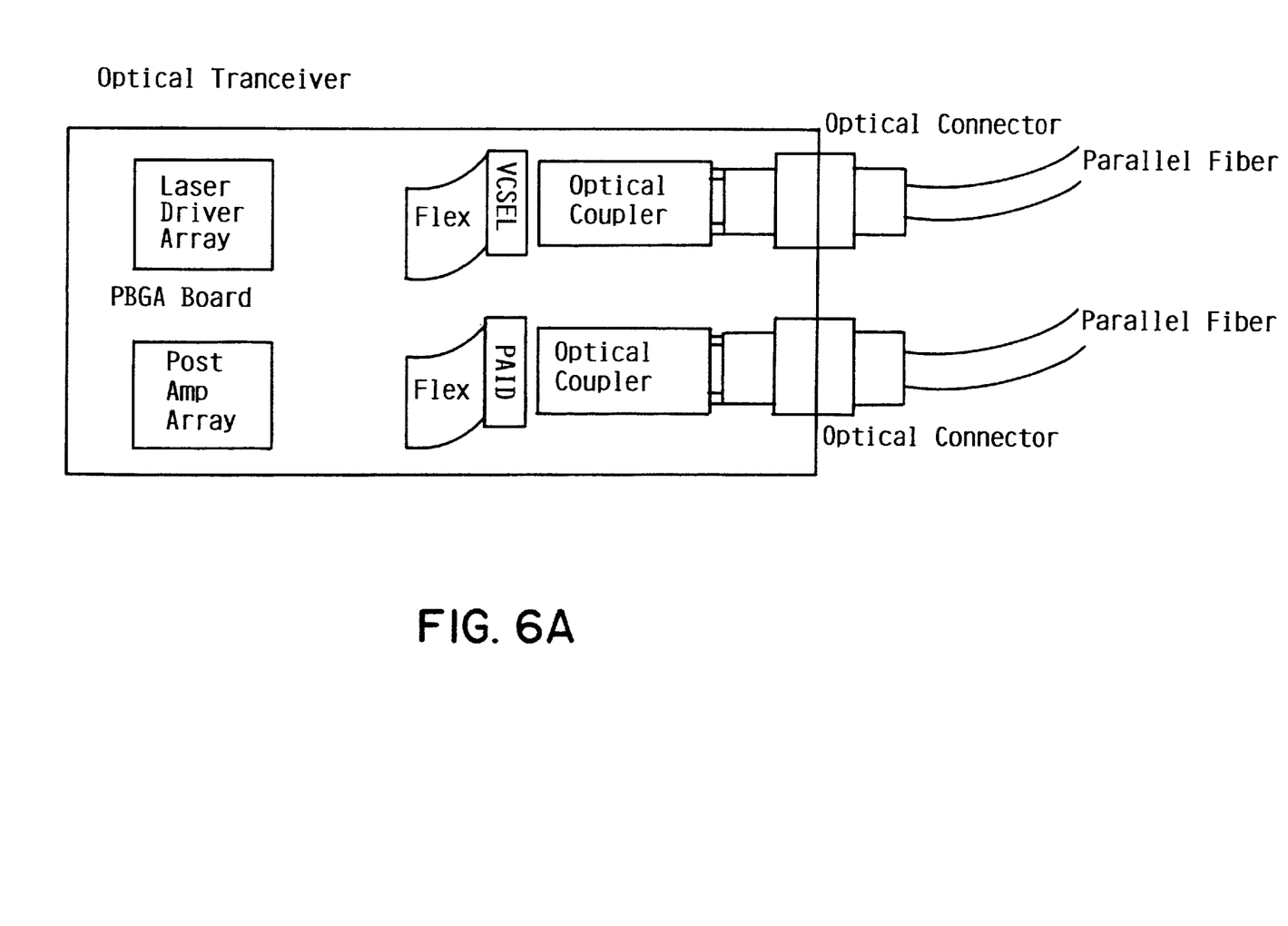
FIGS. 6a and 6b illustrate an application of the invention in an optical transceiver and a system using the transceiver, respectively.
Figure 6B:
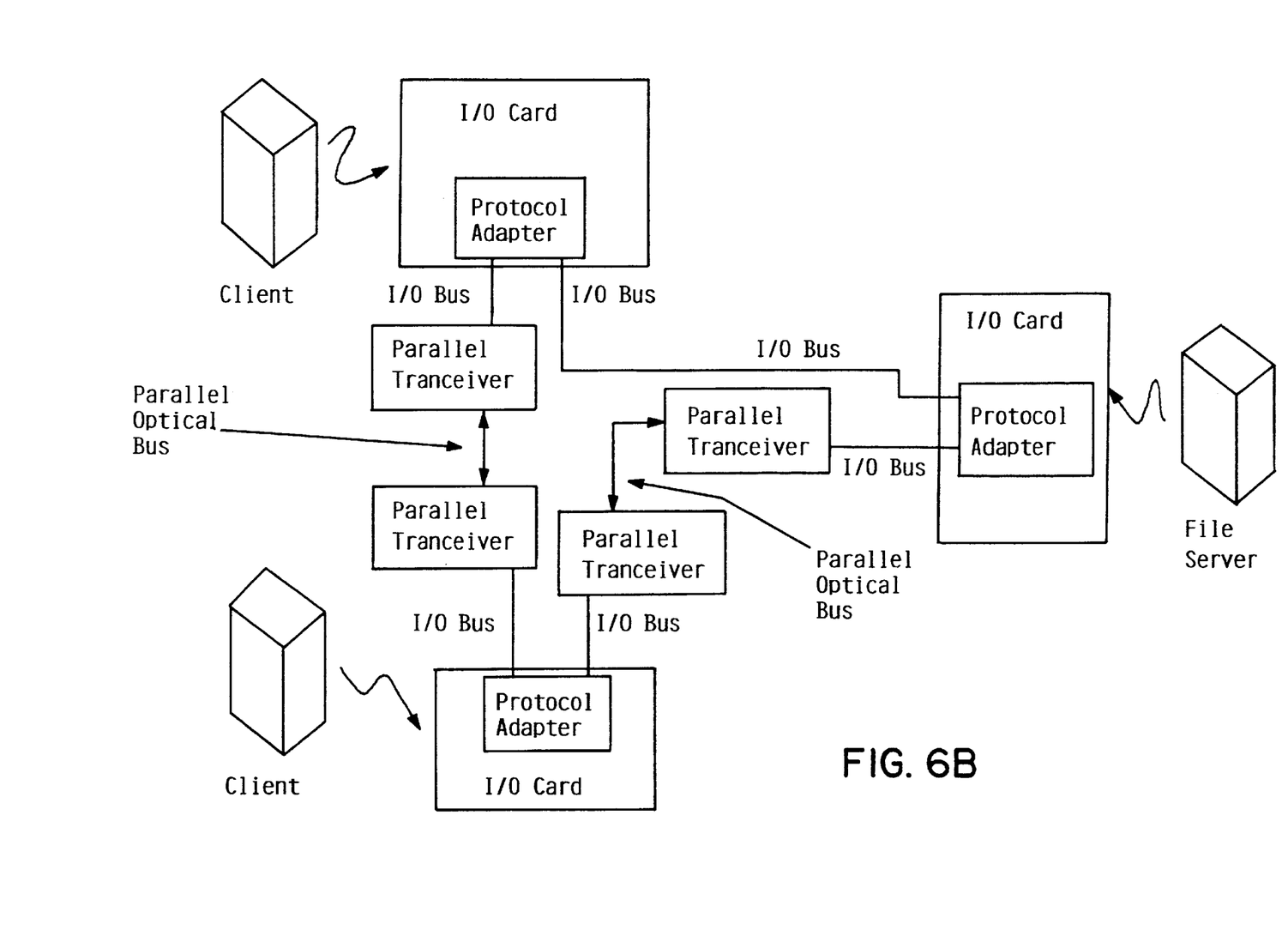

FIGS. 6a and 6b illustrate an application of the invention in an optical transceiver and a system using the transceiver, respectively. The optical transceiver is shown schematically as functional blocks on a PBGA board. One of the blocks is labeled Laser Driver Array, and it is in this block that the exemplary embodiment of the invention would be implemented, for example. The Laser Driver Array is coupled to the VCSEL's by a flexible cable. The optical output of the VCSEL's is coupled into a parallel fiber by an optical connector and optical coupler. The transceiver has a pre-amp integrated detector (PAID) which receives optical input from a parallel fiber through another optical connector and optical coupler. The PAID is coupled to a Post Amp Array by another flexible cable.

A system using four transceivers, such as the transceiver just described, is shown in FIG. 6b. In the illustrated system, there are two client boxes and a file server, each having an input/output (I/O) card with a protocol adapter coupling the device to a respective I/O bus. One client is connected to the file server on an I/O bus directly, i.e., electrically. The other client is connected to the file server via a parallel optical bus having transceivers at each end which are coupled to the respective I/O buses. The two clients are connected optically in the same manner.

Further, although the invention is described with respect to an STI/CML implementation, the invention is not limited to these particular receiver types. (As noted above, the STI receiver is a species of low-voltage differential signal (LVDS) receiver.)

It will be apparent to one skilled in the art that the manner of making and using the claimed invention has been adequately disclosed in the above-written description of the preferred embodiment(s) taken together with the drawings. It will be understood that the above described preferred, embodiment(s) of the present invention are susceptible to various modifications, changes, and adaptations, and the same are intended to be comprehended within the meaning and range of equivalents of the appended claims.

Further, although a number of equivalent components may have been mentioned herein which could be used in place of the components illustrated and described with reference to the preferred embodiment(s), this is not meant to be an exhaustive treatment of all the possible equivalents, nor to limit the invention defined by the claims to any particular equivalent or combination thereof. A person skilled in the art would realize that there may be other equivalent components presently known, or to be developed, which could be used within the spirit and scope of the invention defined by the claims.

What is claimed is:

1. A selectable receiver, comprising:
    an input for receiving an input signal
    a first current mode logic receiver module coupled to the input;
    a second low-voltage differential signal receiver module, different from the first receiver module, coupled to the input;
    a first common mode voltage network for providing a first common,mode voltage, associated with the first receiver module, to the input; and
    a second common mode voltage network for providing a second common mode voltage, associated with the second receiver module, to the input;
    wherein the first receiver module, the second receiver module, the first common mode voltage network, and the second common mode voltage network can be selectably enabled based on a control signal.

2. The receiver according to claim 1, wherein the input comprises a pair of differential inputs for receiving differential input signals.

3. The receiver according to claim 2, wherein the pair of differential inputs are for receiving:
    differential current mode logic (CML) differential input signals for the first receiver module; and
    low-voltage differential signal (LVDS) input signals for the second receiver module.

4. The receiver according to claim 3, further comprising coupling means for selectively coupling the first common mode voltage network and the second common mode voltage network to the current mode logic receiver module and the low-voltage differential signal receiver module, respectively;
    wherein the coupling means comprises:
        a select signal generating means for generating a select signal based on an external control signal;
        a first pass gate for passing the first common mode voltage level to the current mode logic receiver module, in response to a first state of the select signal; and
        a second pass gate for passing the second common mode voltage level to the low-voltage differential signal receiver module, in response to a second different state of the select signal;
    wherein the first common mode voltage level is consistent with a current mode logic signal level, and the second common mode voltage level is consistent with a low-voltage differential signal level; and
    wherein, if the differential input signal is direct coupled to the pair of differential inputs, then common mode voltages are provided by the differential input signal.

5. The receiver according to claim 4, wherein the common mode voltage networks each comprise a voltage divider.

6. The receiver according to claim 5, wherein:
    the common mode voltage networks each further comprise a switch for switching the respective voltage divider to connect to a voltage source,
    the respective voltage dividers comprise resistive voltage dividers; and
    the respective switches comprise switching transistors.

7. The receiver according to claim 3, further comprising:
    output selection means responsive to a control signal for selecting either an output from the current mode logic receiver module or an output from the low-voltage differential signal receiver module, as an output of the receiver circuit.

8. The receiver according to claim 7, wherein the output selection means comprises a multiplexer.

9. The receiver according to claim 8, further comprising control logic signal conditioning circuitry including:
    first logic means for receiving a single-ended CMOS signal and converting it to a bipolar differential signal; and
    second logic means for down shifting the bipolar signal to provide a control signal to the multiplexer.

10. The receiver according to claim 9, further comprising power control means for selectably controlling power to the first receiver module and the second receiver module, so that only one respective receiver module is powered on any time, and so that both respective receiver modules can be powered off at the same time.

11. The receiver according to claim 10, wherein the common mode voltage networks each comprise a voltage divider.

12. The receiver according to claim 11, wherein:
    the common mode voltage networks each further comprise a switch for switching the respective voltage divider to connect to a voltage source;
    the respective voltage dividers comprise resistive voltage dividers; and
    the respective switches comprise switching transistors.

13. The receiver according to claim 1, further comprising power control means for selectably controlling power to the first receiver module and the second receiver module, so that only one respective receiver module is, powered on any time, and so that both respective receiver modules can be powered off at the same time.

14. The receiver according to claim 13, wherein the common mode volt age networks each comprise a voltage divider.

15. The receiver according to claim 14, wherein
    the common mode voltage networks each further comprise a switch for switching the respective voltage divider to connect to a voltage source;
    the respective voltage dividers comprise resistive voltage dividers; and
    the respective switches comprise switching transistors.

16. A selectable receiver comprising:
    a first receiver module for receiving first signal type;
    a second receiver module different from the first receiver module, for receiving a second signal type;
    common mode voltage providing means for selectively providing one of a first common mode voltage associated with the first signal type to the first receiver module and a second common mode voltage associated with the second signal type to the second receiver module; and
    selecting means for selecting one of the first receiver module and the second receiver module, and for selecting one of the first common mode voltage and the second common mode voltage, based on a control signal.

17. A receiver method for receiving first and second signal types, comprising utilizing the receiver according to claim 16.

18. A receiver method for receiving first and second signal types, comprising utilizing the receiver according to claim 1.

19. A receiver method for receiving first and second signal types, comprising:

providing a selectable receiver having first and second receiver modules and first and second common mode voltage networks;

providing one of the first and second signal types at an input of the selectable receiver; and providing a control signal to the selectable receiver based on the signal type provided at the input of the selectable receiver;

wherein when the first signal type is provided at an input of the selectable receiver, the first receiver module is enabled by the control signal and a first common mode voltage is generated in the receiver by the first common mode voltage network;

wherein when the second signal type is provided at an input of the selectable receiver, the second receiver module is enabled by the control signal and a second common mode voltage is generated in the receiver by the second common mode voltage network.

20. A receiver according to claim 1, wherein the first receiver module comprises a differential current mode logic (CML) receiver module; and the second receiver module comprises a low-voltage differential signal (LVDS) self-timed interface (STI) receiver module.

21. A system comprising:

a parallel optical transmitter having a plurality of optical output devices and associated drivers;

each of the associated drivers having a selectable receiver, including:

an input for receiving an electrical input signal;

a first receiver module coupled to the input;

a second receiver module, different from the first receiver module, coupled to the input;

a first common mode voltage network for providing a first common m ode voltage, associated with the first receiver module, to the input; and a second common mode voltage network for providing a second common mode voltage, associated with the second receiver module, to the input;

wherein the first receiver module, the second receiver module, the first common mode voltage network, and the second common mode voltage network can be selectably enabled based on a control signal.

22. The system according to claim 21, wherein the first receiver module comprises a differential current mode logic (CML) receiver module; and the second receiver module comprises a low-voltage differential signal (LVDS) self-timed interface (STI) receiver module.

23. The system according to claim 21, further comprising a parallel optical receiver having a plurality of optical input devices.

24. The system according to claim 23, wherein the parallel optical receiver and the parallel optical transmitter are packaged together as a parallel optical transceiver.

25. The system according to claim 24, wherein there are a plurality of parallel optical transceivers, pairs of which are coupled together by a respective parallel optical bus.

26. The system according to claim 25, wherein the parallel optical bus comprises a parallel optical fiber, and the plurality of optical output deices comprise vertical cavity surface emitting lasers.

* * * * *